(12) United States Patent
Yoon et al.

(10) Patent No.: US 11,183,324 B2
(45) Date of Patent: Nov. 23, 2021

(54) INDUCTOR ARRAY

(71) Applicant: SAMSUNG ELECTRO-MECHANICS CO., LTD., Suwon-si (KR)

(72) Inventors: Chan Yoon, Suwon-si (KR); Won Chul Sim, Suwon-si (KR); Dong Hwan Lee, Suwon-si (KR); Young Ghyu Ahn, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 599 days.

(21) Appl. No.: 16/032,491

(22) Filed: Jul. 11, 2018

(65) Prior Publication Data

US 2019/0115135 A1    Apr. 18, 2019

(30) Foreign Application Priority Data

Oct. 16, 2017   (KR) .................. 10-2017-0134149

(51) Int. Cl.
| | | |
|---|---|---|
| *H01F 5/00* | (2006.01) | |
| *H01F 17/00* | (2006.01) | |
| *H01F 27/28* | (2006.01) | |
| *H01F 27/29* | (2006.01) | |
| *H05K 1/18* | (2006.01) | |
| *H01F 17/04* | (2006.01) | |

(52) U.S. Cl.
CPC ..... *H01F 17/0013* (2013.01); *H01F 17/0033* (2013.01); *H01F 27/2804* (2013.01); *H01F 27/2847* (2013.01); *H01F 27/292* (2013.01); *H05K 1/181* (2013.01); *H05K 1/182* (2013.01); *H01F 2017/048* (2013.01); *H01F 2027/2809* (2013.01)

(58) Field of Classification Search
USPC ......................... 336/200, 232, 192
See application file for complete search history.

(56) References Cited

U.S. PATENT DOCUMENTS

| | | | | |
|---|---|---|---|---|
| 3,436,687 A | * | 4/1969 | Andrews, Jr. ............ | H03H 7/32 333/140 |
| 4,888,568 A | * | 12/1989 | Kawaguchi .......... | H03H 7/0115 333/174 |
| 6,950,006 B1 | * | 9/2005 | Shikama ................. | H01F 17/06 336/200 |

(Continued)

FOREIGN PATENT DOCUMENTS

| | | |
|---|---|---|
| JP | 2017-034124 A | 2/2017 |
| KR | 10-2008-0102993 A | 11/2008 |
| KR | 10-2017-0048570 A | 5/2017 |

*Primary Examiner* — Shawki S Ismail
*Assistant Examiner* — Kazi S Hossain
(74) *Attorney, Agent, or Firm* — Morgan, Lewis & Bockius LLP

(57) ABSTRACT

An inductor array includes a body including at least three coils and external electrodes arranged on external surfaces of the body. The at least three coils are arranged to be spaced apart from each other by a predetermined distance in one direction of the body, and here, the at least three coils have the same characteristic value. A minimum distance between mutually adjacent coils among the at least three coils is changed according to the number of turns of a coil pattern included in an area formed between the centers of cores of mutually adjacent coils.

13 Claims, 3 Drawing Sheets

(56) References Cited

U.S. PATENT DOCUMENTS

| | | | |
|---|---|---|---|
| 7,259,639 B2* | 8/2007 | DeBhailis | H01F 17/0006 |
| | | | 333/132 |
| 2001/0030593 A1* | 10/2001 | Imada | H01F 17/0013 |
| | | | 336/200 |
| 2002/0083575 A1* | 7/2002 | Anbo | H01F 41/043 |
| | | | 29/602.1 |
| 2008/0150668 A1* | 6/2008 | Gabara | G06F 1/10 |
| | | | 336/200 |
| 2008/0290977 A1 | 11/2008 | Ito et al. | |
| 2010/0277267 A1* | 11/2010 | Bogert | H01F 3/10 |
| | | | 336/221 |
| 2016/0035477 A1* | 2/2016 | Yeh | H01F 41/042 |
| | | | 320/108 |
| 2017/0047155 A1* | 2/2017 | Yao | H01F 27/24 |
| 2017/0162329 A1* | 6/2017 | Ota | H01G 2/065 |
| 2017/0194939 A1 | 7/2017 | Mukai | |

* cited by examiner

INDUCTOR ARRAY

CROSS-REFERENCE TO RELATED APPLICATION

This application claims benefit of priority to Korean Patent Application No. 10-2017-0134149 filed on Oct. 16, 2017 in the Korean Intellectual Property Office, the disclosure of which is incorporated herein by reference in its entirety.

BACKGROUND

1. Field

The present disclosure relates to an inductor array.

2. Description of Related Art

As miniaturized electronic products such as smartphones, and the like, have been actively developed, demand for compact, thin, and highly efficient power inductors for high current is increasing.

Accordingly, products of 2016 size and 1 mm thickness are employed in products formerly using 2520 size and 1 mm thickness, and such products are expected to be miniaturized to products of 1608 size and 0.8 mm thickness.

In addition, demand for arrays with the advantage of reducing a mounting area has also increased, and here, arrays may have a non-coupled or coupled inductor form or a mixture thereof according to coupling coefficients or mutual inductances between a plurality of coil parts.

In the case of a non-coupled inductor array in which a plurality of coils are spaced apart from each other and not influenced by mutual magnetic fluxes, if inductances of the coils are realized to be equal, a mounting area may be reduced and efficiency of the inductor array chip may be increased.

In the case of the non-coupled inductor array, it is important to minimize mutual inductance by lowering a coupling coefficient between two coils. If the coupling coefficient is higher than a specific coupling coefficient, a voltage rise phenomenon may occur in a microcurrent region due to mutual inductance between the two coils. In order to prevent this, the coupling coefficient is commonly required to be approximately 0.05 or less. A distance between the two coils commonly needs to be increased to lower the coupling coefficient between the two coils, but, due to a limitation in chip size, it may be difficult to increase the space between two coils to similarly lower the coupling coefficient between all coils to the specific coupling coefficient or lower.

SUMMARY

An aspect of the present disclosure may provide an inductor array, which includes a plurality of coils, having a structure in which coupling coefficients between all the coils are lowered to a specific coupling coefficient or lower.

According to an aspect of the present disclosure, an inductor array may include a body and external electrodes arranged on external surfaces of the body. The body includes a first side surface and a second side surface opposing each other in a width direction, a first end surface and a second end surface opposing each other in a length direction, and an upper surface and a lower surface opposing each other in a thickness direction, and at least three coils included in the body are spaced apart from each other in the length direction. The at least three coils may each have a same line width and a same number of turns of coil patterns. A minimum distance between first and second coils among the at least three coils is larger than a minimum distance between the second coil and a third coil among the at least three coils, and a number of turns of the coil patterns of the first and second coils in an area between centers of the first and second coils is larger than a number of turns of the coil patterns of the second and third coils in an area between centers of the second and third coils.

According to an aspect of the present disclosure, an inductor array may include a body and external electrodes arranged on external surfaces of the body. The body includes a first side surface and a second side surface opposing each other in a width direction, a first end surface and a second end surface opposing each other in a length direction, and an upper surface and a lower surface opposing each other in a thickness direction, and at least three coils included in the body are spaced apart from each other in the length direction. The at least three coils may each have a same line width and a same number of turns of coil patterns. A minimum distance between first and second coils of the at least three coils is equal to a minimum distance between the second coil and a third coil of the at least three coils, and a number of turns of the coil patterns of the first and second coils in an area between centers of the first and second coils is equal to a number of turns of the coil patterns of the second and third coils in an area between centers of the second and third coils.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

Hereinafter, an inductor array according to an exemplary embodiment will be described but is not limited thereto.

Figure 1:
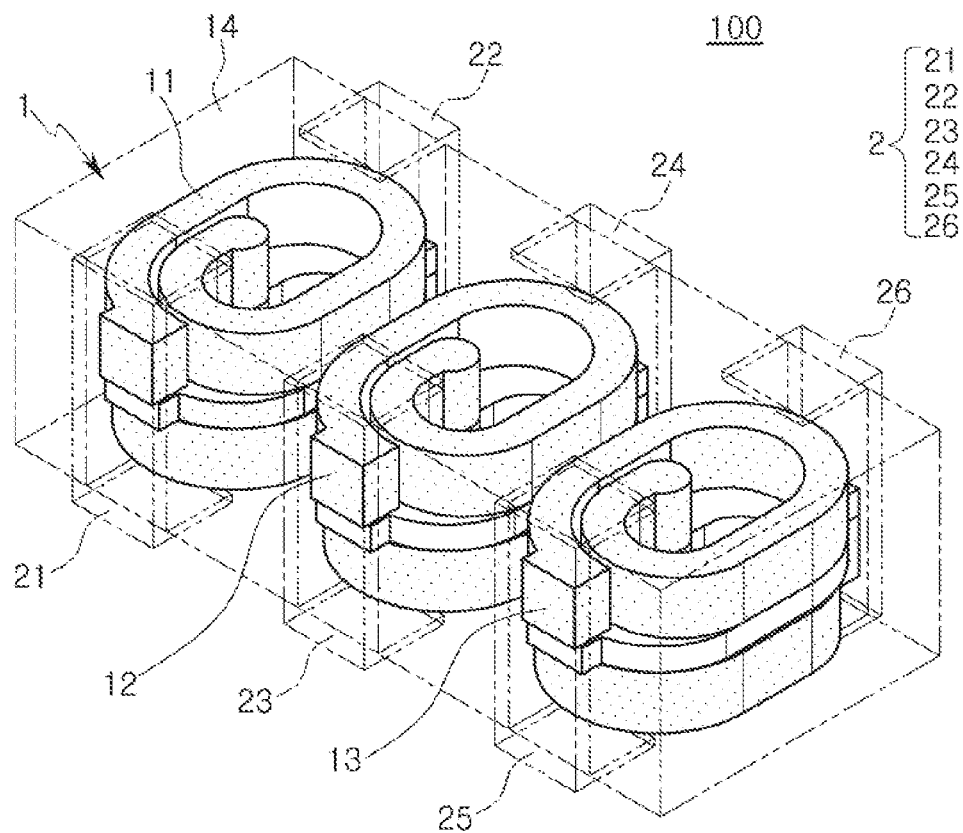
FIG. 1 is a schematic perspective view of an inductor array according to a first exemplary embodiment.
Figure 2:
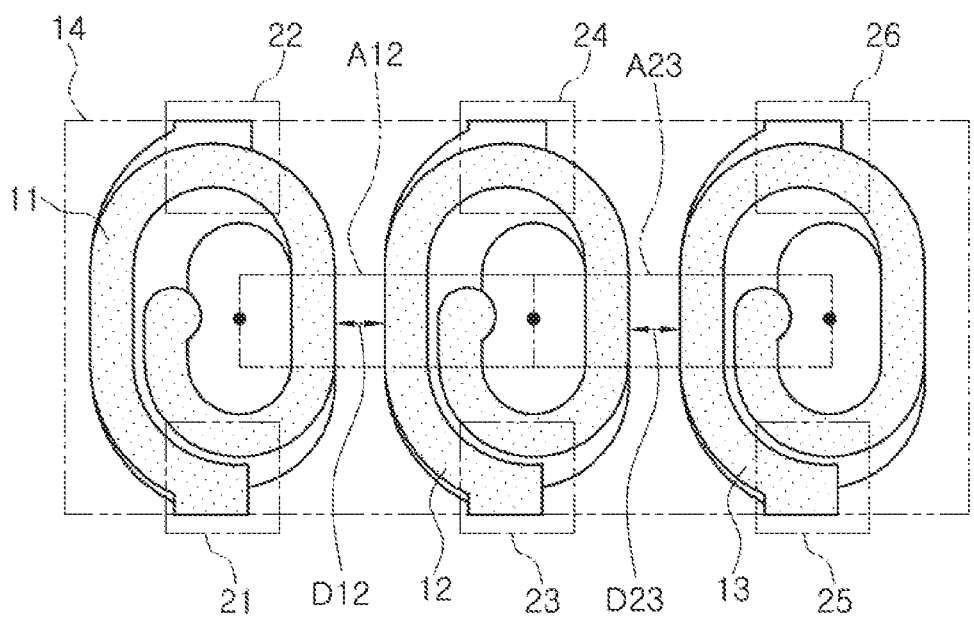
FIG. 2 is a top plan view of the inductor array of FIG. 1.

FIG. 1 is a schematic perspective view of an inductor array according to a first exemplary embodiment, and FIG. 2 is a top plan view of the inductor array of FIG. 1.

Referring to FIGS. 1 and 2, an inductor array 100 according to the first exemplary embodiment includes a body 1 and external electrodes 2 arranged on external surfaces of the body 1.

The body 1 forms an overall appearance of the inductor array. The body 1 has an upper surface and a lower surface opposing each other in the thickness direction of the body, a first end surface and a second end surface opposing each other in the length direction, and a first side surface and a second side surface opposing each other in the width direction, substantially forming a hexahedral shape, but is not limited thereto.

The body 1 includes first to third coils 11, 12, and 13 sealed within a magnetic material 14.

The magnetic material 14 may have a structure in which magnetic particles are dispersed in a resin. The magnetic particles may be metal-based soft magnetic powder particles formed of a crystalline or amorphous metal including at least one selected from the group consisting of, for example, iron (Fe), silicon (Si), boron (B), chromium (Cr), aluminum (Al), copper (Cu), niobium (Nb), and nickel (Ni). The resin may be a thermoplastic resin or a thermosetting resin. Examples of the thermosetting resin include benzocyclobutene (BCB), an epoxy resin, a phenol resin, a vinylester resin, a polyimide resin (PI), a polyvinylbenzyl ether resin, and the like. Examples of the thermoplastic resin include a polyethylene resin (PE), a polypropylene resin (PP), a polybutene resin, a polyvinyl alcohol resin, and the like.

Referring to the first to third coils 11, 12, and 13 sealed with the magnetic material 14, the first to third coils 11, 12, and 13 are spaced apart from each other at a predetermined interval in the length direction L of the body.

The coils may each be classified as a multilayer coil, a winding type coil, and a thin film type coil according to ways in which coils are formed, and may be appropriately selected according to desired functional characteristics. In particular, recently, coils having a high aspect ratio tend to be desired, and since thin film type coils may have a high aspect ratio, the first to third coils may be thin film type coils employing anisotropic plating, or the like.

The number of turns and a line width of the coil patterns of each of the first to third coils 11, 12 and 13 may be appropriately set according to specifications requested of the coils, but here, in order to control coupling coefficients among the coils, the numbers of turns and the line widths of the coil patterns of the first to third coils may be adjusted to be equal. In other words, the first to third coils may be formed as same coils all having the same characteristic value. Further, the characteristic values of the first to third coils may be easily controlled to be the same when materials thereof are the same, and thus, the materials of the first to third coils are the same.

Opposing ends of the first coil 11 are electrically connected to first and second external electrodes 21 and 22 opposing each other in the width direction of the body, respectively, and similarly, opposing ends of the second coil 12 and opposing ends of the third coil 13 are electrically connected to third and fourth external electrodes 23 and 24 and fifth and sixth external electrodes 25 and 26 facing each other in the width direction of the body, respectively. As such, since the coils and the respective external electrodes are electrically connected to each other, the external electrodes may include a metal having excellent electrical conductivity. For example, the external electrodes may include copper (Cu), silver (Ag), nickel (Ni), or Tin (Sn) alone or alloys thereof.

Referring to a scheme in which the first to third coils 11, 12, 13 are arranged, parallel symmetry is formed between the first and second coils 11 and 12. Here, the "parallel symmetry" refers to the fact that the second coil 12 appears as a shifted version of the first coil 11 by a predetermined distance only in the length direction of the body. Similarly, parallel symmetry is formed between the second and third coils 12 and 13. That is, in the inductor array 100 according to the first exemplary embodiment, a combination of the first and second coils realize the same structure as that of a combination of the second and third coils adjacent thereto.

In this case, the minimum distance D12 between the first and second coils 11 and 12 is equal to the minimum distance D23 between the second and third coils 12 and 13. This is because, the minimum distance D between the two coils adjacent to each other is controlled to be larger as the number of turns of the coil patterns of the first and second coils 11 and 12 with respect to a region A12 formed by connecting the center of a core of the first coil 11 and the center of a core of the second coil 12 increases. Generally, when the same plurality of coils are arranged in the inductor array, a coupling coefficient between adjacent coils is affected by a distance between the plurality of coils, and here, as the distance is increased, the coupling coefficient is lowered. However, the distance between the coils may not be unlimitedly increased in order to lower the coupling coefficient while maintaining a package of a predetermined size, and thus, in the inductor array of the present disclosure, the minimum distance between the coils is differentiated according to the number of turns of the coil patterns with respect to the region A12 formed between the centers of the cores of the first and second coils 11 and 12.

Figure 3:
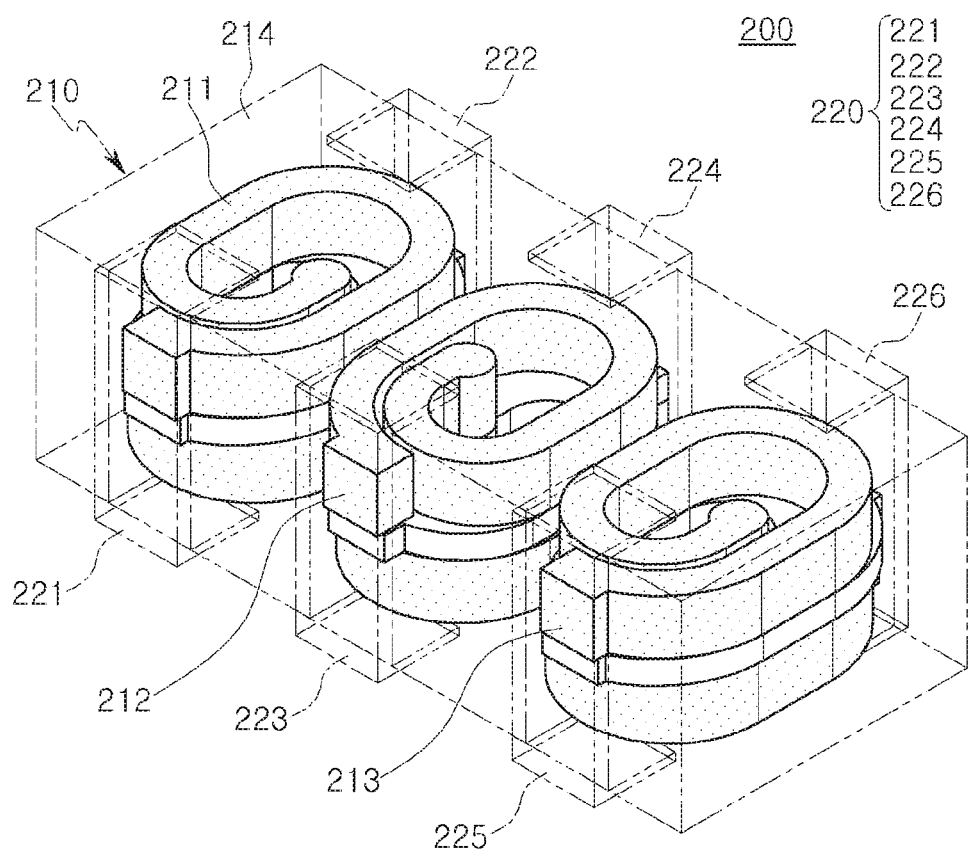
FIG. 3 is a schematic perspective view of an inductor array according to a second exemplary embodiment.
Figure 4:
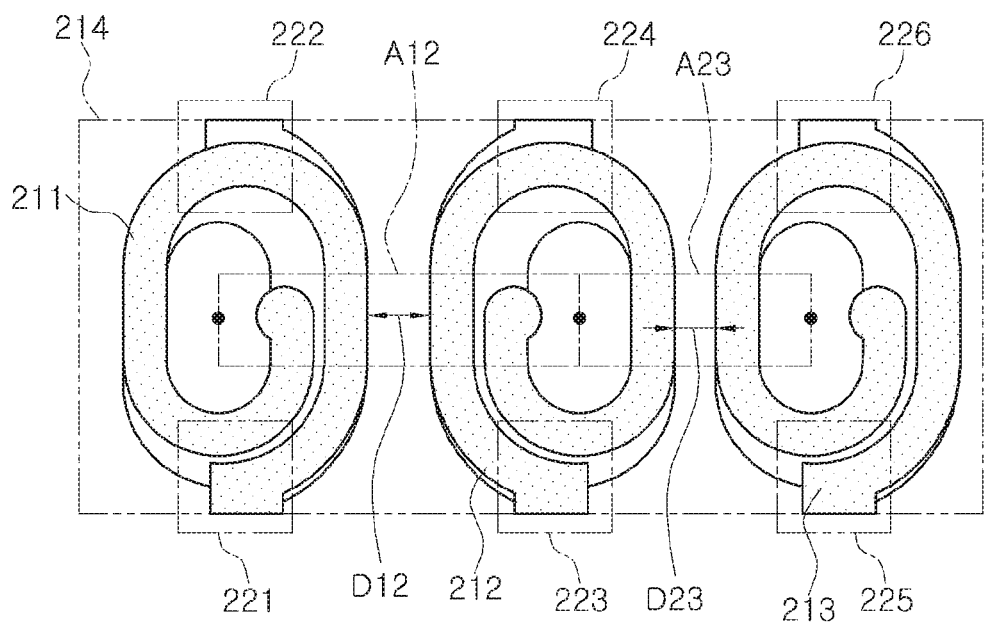
FIG. 4 is a top plan view of the inductor array of FIG. 3.

FIG. 3 is a schematic perspective view of an inductor array 200 according to a second exemplary embodiment, and FIG. 4 is a top view of the inductor array 200 of FIG. 3.

The inductor array 200 illustrated in FIGS. 3 and 4 differs from the inductor array 100 illustrated in FIGS. 1 and 2 in the arrangement of the first to third coils 211, 212, and 213. For the purposes of description, the same description as that of the inductor array of FIGS. 1 and 2 will be omitted.

Referring to FIGS. 3 and 4, the inductor array 200 includes a body 210 and external electrodes 220 on external surfaces of the body 210.

Inside the body 210, first to third coils 211, 212, and 213 sealed within a magnetic material 214 are arranged to be spaced apart from each other in the length direction.

Mirror symmetry is formed between the first and second coils 211 and 212. Here, mirror symmetry refers to a positional or orientational relationship in which the second coil 212 appears as a mirror image of the first coil 211 with respect to a mirror on a W-T plane between the first and second coils. The second coil 212 may thus be symmetrical with respect to the first coil 211 relative to the mirror on the W-T plane between the first and second coils. Similarly, mirror symmetry is formed between the second and third coils 212 and 213. In other words, the first and second coils 211 and 212 and the second and third coils 212 and 213 are arranged in mirror symmetry with each other.

Meanwhile, the minimum distance D12 between the first and second coils is larger than the minimum distance D23 between the second and third coils. This is because, the minimum distance D between the two coils adjacent to each other is controlled to be larger as the number of turns of the coil patterns of the first and second coils with respect to a region A12 formed by connecting the center of a core of the first coil 11 and the center of a core of the second coil 212 increases. Since the number of turns of the coil pattern in the area A12 formed between the centers of cores of the first and second coils 211 and 212 is larger than the number of turns of the coil pattern in the area A23 formed between the centers of the cores of the second and third coils 212 and 213, the minimum distance between the first and second coils 211 and 212 can be controlled to be larger than the minimum distance between the second and third coils 212 and 213 in order to lower a coupling coefficient between the coils.

Opposing ends of the first to third coils 211, 212 and 213 are connected to first and second external electrodes 221 and 222, third and fourth external electrodes 223 and 224, and fifth and sixth external electrodes 225 and 226, respectively.

Figure 5:
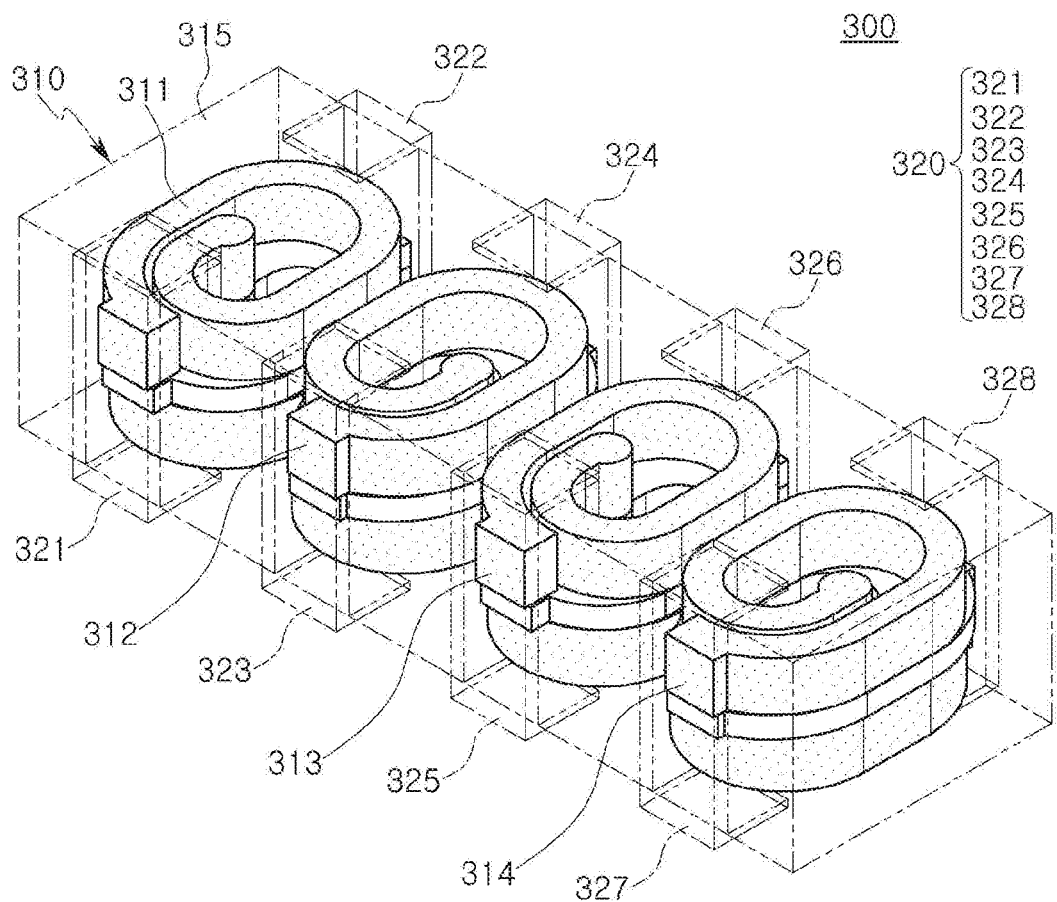
FIG. 5 is a schematic perspective view of an inductor array according to a third exemplary embodiment.
Figure 6:
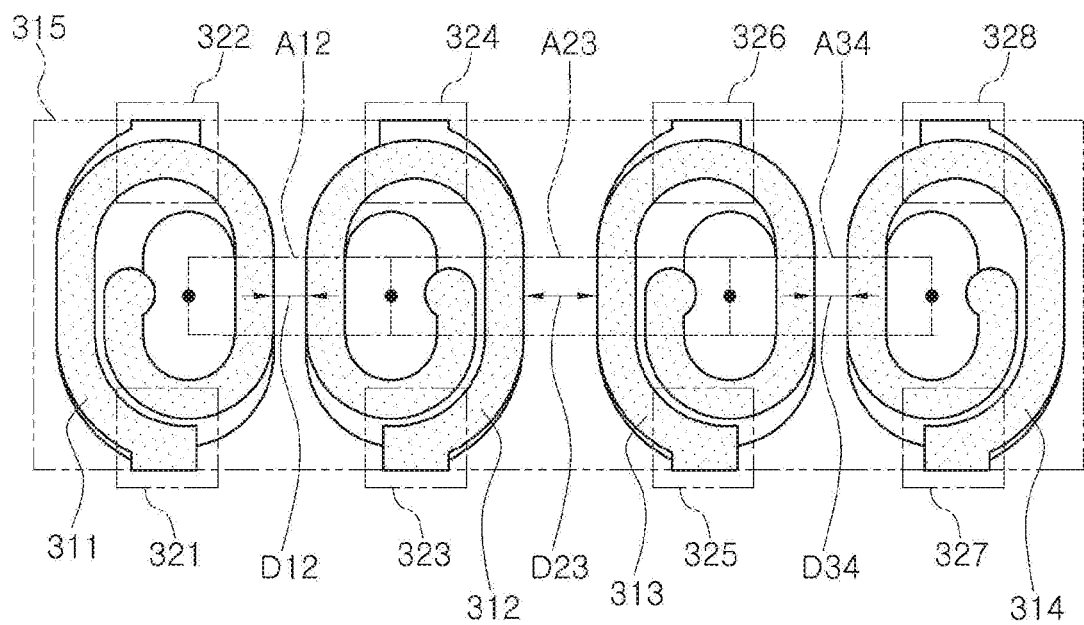
FIG. 6 is a top plan view of the inductor array of FIG. 5.

FIG. 5 is a perspective view of an inductor array 300 according to a third exemplary embodiment, and FIG. 6 is a top plan view of the inductor array 300 of FIG. 5.

Referring to FIGS. 5 and 6, the inductor array 300 includes a body 310 and external electrodes 320 on external surfaces of the body 310.

The body 310 of the inductor array 300 includes four coils sealed by a magnetic material 315. The first to fourth coils 311, 312, 313, and 314 are connected to first and second external electrodes 321 and 322, third and fourth external electrodes 323 and 324, fifth and sixth external electrodes 325 and 326, and seventh and eighth external electrodes 327 and 328 arranged to be parallel to each other in the width direction of the body 310, respectively.

The first to fourth coils 311, 312, 313, and 314 are arranged to be spaced apart in the length direction of the body.

The first and second coils 311 and 312, the second and third coils 312 and 313, and the third and fourth coils 313 and 314 are arranged in mirror symmetry respectively using the W-T plane between the first and second coils, the W-T plane between the second and third coils, and the W-T plane between the third and fourth coils as mirror surfaces.

The minimum distance D12 between the first and second coils is narrower than the minimum distance D23 between the second and third coils because the number of turns of the coil patterns of the first and second coils in the area A12 formed between the center of the cores of the first and second coils is smaller than the number of turns of the coil patterns of the second and third coils in the area A23 formed between the centers of the cores of the second and third coils.

Similarly, a minimum distance D34 between the third and fourth coils is narrower than the minimum distance D23 between the second and third coils. This is because the number of turns of the coil patterns of the third and fourth coils in the area A34 formed between the centers of the cores of the third and fourth coils is smaller than the number of turns of the coil patterns of the second and third coils in the area A23 formed between the centers of the cores of the second and third coils.

By differentiating the minimum distances between the coils according to the structures in which the first to fourth coils are arranged, an overall coupling coefficient between the coils may be reduced to be smaller than a predetermined value within a limited size. In particular, it is desirable that all the coupling coefficients among the coils are 0.05 or less. This is because, when the coupling coefficient is controlled to 0.05 or less, occurrence of a voltage rise phenomenon in a microcurrent region due to mutual inductance between adjacent coils in a non-coupled inductor array may be prevented.

The Table 1 specifically shows coupling coefficients between coils when a structure of the inductor array 300 according to the third exemplary embodiment was applied to an inductor array under the condition of 1006 (1.0 mm×0.6 mm in length×width reference) 0.45 T 45 μH.

TABLE 1

| Adjacent coil Coupling coefficient | First and second coils 0.035 | Second and third coils 0.046 | Third and fourth coils 0.035 |
|---|---|---|---|

As may be seen from Table 1, the coupling coefficients between respective adjacent coils are controlled to be 0.05 or less and have substantially similar values.

This is meaningful in that the coupling coefficient may be adjusted to the level of 0.05 or less even in a miniaturized size by determining a distance between coils within a limited chip size in consideration of the sum of the winding pattern of the coil pattern included in the area between the centers of the cores of the adjacent coils.

As set forth above, according to exemplary embodiments of the present disclosure, the inductor array in which occurrence of a voltage rise phenomenon in a microcurrent region is prevented by minimizing mutual inductance by lowering a coupling coefficient between adjacent coils in a limited chip size may be provided.

While exemplary embodiments have been shown and described above, it will be apparent to those skilled in the art that modifications and variations could be made without departing from the scope of the present invention as defined by the appended claims.

What is claimed is:

1. An inductor array comprising:
  a body including a first side surface and a second side surface opposing each other in a width direction, a first end surface and a second end surface opposing each other in a length direction, and an upper surface and a lower surface opposing each other in a thickness direction, the body including at least three coils arranged to be spaced apart from each other in the length direction; and
  external electrodes arranged on external surfaces of the body,
  wherein the at least three coils includes first, second, and third coils,
  wherein a minimum distance between the first and second coils is larger than a minimum distance between the second and third coils, and a number of turns of the coil patterns of the first and second coils in an area between centers of the first and second coils is larger than a number of turns of the coil patterns of the second and third coils in an area between centers of the second and third coils, and
  wherein the second coil is arranged between the first coil and the third coil.

2. The inductor array of claim 1, wherein the first, second, and third coils of the at least three coils have a same line width of coil patterns and a same number of turns of the coil patterns.

3. The inductor array of claim 2, wherein the first and third coils have a same winding direction as each other, and the second coil has a winding direction opposite to the first and third coils.

4. The inductor array of claim 2, wherein the first coil is disposed to be mirror symmetrical with respect to the second coil, and the third coil is disposed to be in mirror symmetrical with respect to the second coil.

5. The inductor array of claim 1, wherein a coupling coefficient between mutually adjacent coils among the first, second, and third coils is 0.05 or less.

6. The inductor array of claim 1, wherein opposing ends of each of the first, second, and third coils are connected to external electrodes facing each other in the width direction of the body.

7. The inductor array of claim 1, wherein at least one of the first, second, or third coils is a thin film type coil.

8. The inductor array of claim 1, wherein the first, second, and third coils each are formed of the same material.

9. The inductor array of claim 1, wherein the body includes a magnetic material.

10. The inductor array of claim 9, wherein the magnetic material simultaneously seals the entirety of the first, second, and third coils.

11. The inductor array of claim 1, wherein the body has a length of 1.0 mm and a width of 0.6 mm.

12. The inductor array of claim 11, wherein the body has a thickness of 0.45 mm.

13. The inductor array of claim 11, wherein the body includes four coils.

* * * * *